United States Patent [19]
Whitehead et al.

[11] Patent Number: 6,049,740
[45] Date of Patent: Apr. 11, 2000

[54] PRINTED CIRCUIT BOARD TESTING SYSTEM WITH PAGE SCANNER

[75] Inventors: Cynthia Jane Whitehead, South Lake; Stephen J. Foster, Garland; Evan J. Evans, Alvord, all of Tex.

[73] Assignee: CyberOptics Corporation, Golden Valley, Minn.

[21] Appl. No.: 09/033,358

[22] Filed: Mar. 2, 1998

[51] Int. Cl.[7] .................................................. G05B 19/00
[52] U.S. Cl. ........................... 700/57; 356/392; 382/145; 382/147; 395/500.06
[58] Field of Search ................................... 356/394, 391, 356/392, 397; 700/56, 57, 59, 58; 382/141, 145, 147, 151, 149; 395/500.05, 500.06

[56] References Cited

U.S. PATENT DOCUMENTS

| | | | |
|---|---|---|---|
| 4,469,553 | 9/1984 | Whitehead | 156/627 |
| 4,578,810 | 3/1986 | MacFarlane et al. | 382/8 |
| 5,027,417 | 6/1991 | Kitakado et al. | 382/8 |
| 5,161,202 | 11/1992 | Kitakado et al. | 382/8 |
| 5,513,099 | 4/1996 | Schein | 364/167.01 |

*Primary Examiner*—Paul P. Gordon
*Attorney, Agent, or Firm*—Locke Liddell & Sapp LLP

[57] ABSTRACT

A method for verification of components installed on a printed circuit board includes the step of capturing an image of an entire printed circuit board and components mounted thereon using a scanning device. After it has been determined that a printed circuit board having no defects, the scanned image of the circuit board has no defects is stored in a memory. The image of the entire printed circuit board under test, and having potential defects is then captured using a scanning device. The image of the printed circuit board under test is then stored in a memory. The stored image of the printed circuit board having no defects is then overlaid in registration with the stored image of the printed circuit board with potential defects on a display in alternating sequence in order to visually provide an indication of a defective component or defective component placement on the printed circuit board under test to an operator.

1 Claim, 3 Drawing Sheets

PRINTED CIRCUIT BOARD TESTING SYSTEM WITH PAGE SCANNER

TECHNICAL FIELD OF THE INVENTION

The present invention relates to printed circuit board component testing and repair systems and methods, and more particularly, to a method for verifying properly placed components on a printed circuit board utilizing a scanning input device.

BACKGROUND OF THE INVENTION

Printed circuit boards comprise a support structure formed from an electrically insulative material and having formed on at least one side thereof a series of electrically conductive paths or leads in the form of traces and pads. Typically, a plurality of apertures are formed through the board, and components are mounted on the board by insertion of electrically conductive pins extending from each component through the apertures. Solder connections are then formed between the conductive pins of the components and the conductive leads of the printed circuit board, thereby completing the necessary electrical connections between the various components.

As will be readily apparent, when a particular printed circuit board requires the replacement, addition, removal and/or testing of numerous components, many opportunities exist for operator error. For example, many types of components are almost identical in appearance, but widely differ in function. When the design of a particular printed circuit board requires the positioning of different types of components in relatively adjacent locations, the mounting or testing of components in incorrect locations or the removal of components from incorrect locations can usually occur. In addition, integrated circuits and other components often have a particular polarity. Even when the conductive pins of such a component are positioned in a correct aperture, the orientation of the component may be reversed, which means that the polarity of the component is incorrect.

Various systems have been proposed for component verification on printed circuit boards, such as, for example, the system and method disclosed in U.S. Pat. No. 4,469,553 issued to Robert E. Whitehead on Sep. 4, 1984. The system of the '533 Patent projects circuit board data, such as, for example, "Gerber" data from a plasma screen of a computer onto a half mirror. A printed circuit board is positioned beneath the mirror. The board can be viewed through the mirror while at the same time the "Gerber" data and component data is projected on the mirror in registry with the circuit board, so that an operator can view the circuit board through the mirror for correlating the "Gerber" data and component data projected onto the mirror with the actual circuit board positioned below the mirror.

A need has arisen for a improved system for verification of components and proper orientation of components on printed circuit boards.

SUMMARY OF THE INVENTION

In accordance with the present invention, a method for verification of components installed on a printed circuit board includes the step of capturing an image of an entire printed circuit board and components mounted thereon using a scanning device. After it has been determined that a printed circuit board has no defects, the scanned image of the circuit board having no defects is stored in a memory. The image of the entire printed circuit board under test, and having potential defects is then captured using a scanning device. The image of the printed circuit board under test is then stored in a memory. The stored image of the printed circuit board having no defects is then overlaid in registration with the stored image of the printed circuit board with potential defects on a display in alternating sequence in order to visually provide an indication of a defective component or defective component placement on the printed circuit board under test to an operator.

BRIEF DESCRIPTION OF THE DRAWINGS

For a more complete understanding of the present invention and for further advantages thereof, reference is now made to the following Description of the Preferred Embodiments taken in conjunction with the accompanying Drawings in which.

DESCRIPTION OF THE PREFERRED EMBODIMENTS

Figure 1:
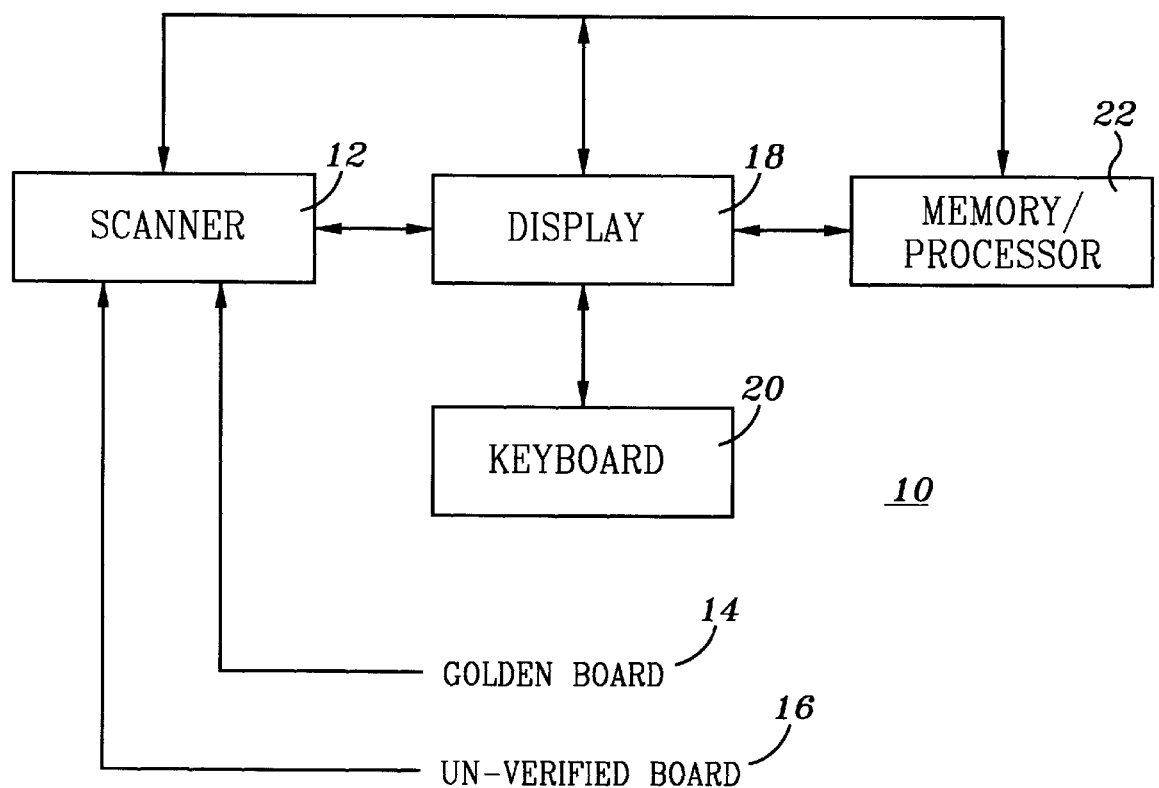
FIG. 1 is a block diagram of a system for carrying out the present method.

Referring to FIG. 1, the present method is performed at a workstation, generally identified by the numeral 10. Workstation 10 includes an optical scanning device 12 such as, for example, a model 6100C manufactured by Hewlett-Packard. Scanning device 12 captures the image of a non-defective printed circuit board ("Golden" board 14) having no defective installed components. The scanner 12 also scans or captures the image of the printed circuit board under test or the unverified board 16 which is being checked for proper component placement and 10 installation.

The output of scanner 12 is displayed on a monitor 18, having an associated keyboard 20. A computer processor/memory 22 stores the images captured by scanner 12 and controls operation of scanner 12 and display 18. The present invention allows for images of unverified boards to be optically compared to the Golden board by an operator viewing the alternating sequential display between the Golden board image and the unverified board image at display 18. The use of scanner 12 replaces a conventional camera mounted on an X/Y positioning mechanism so that the entire board image, both the Golden board 14 and unverified board 16 can be captured in a single step, eliminating the need for camera repositioning.

Figure 2:
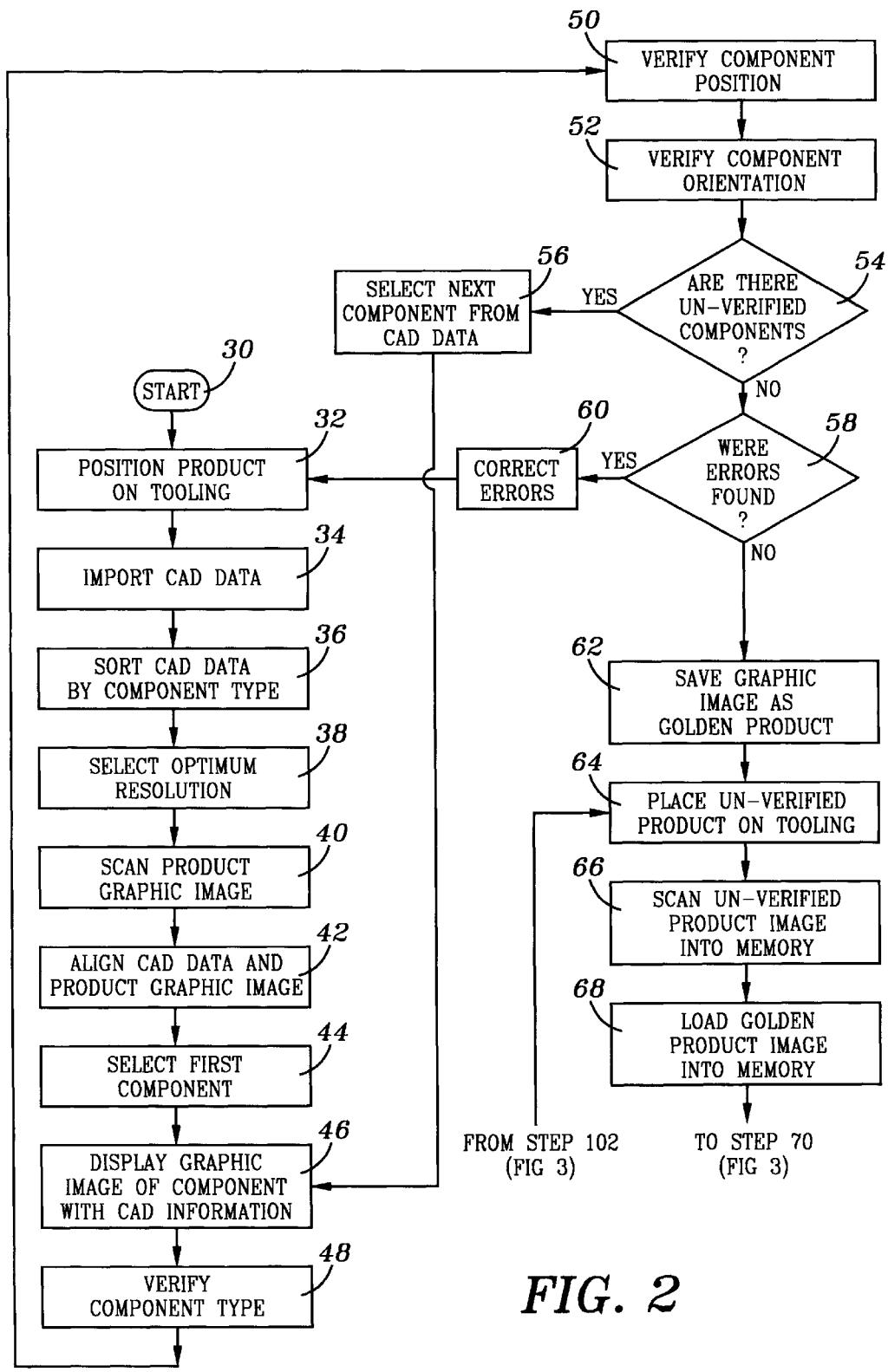
FIGS. 2 and 3 are block diagrams illustrating the steps of the present method for printed circuit board component verifications.
Figure 3:
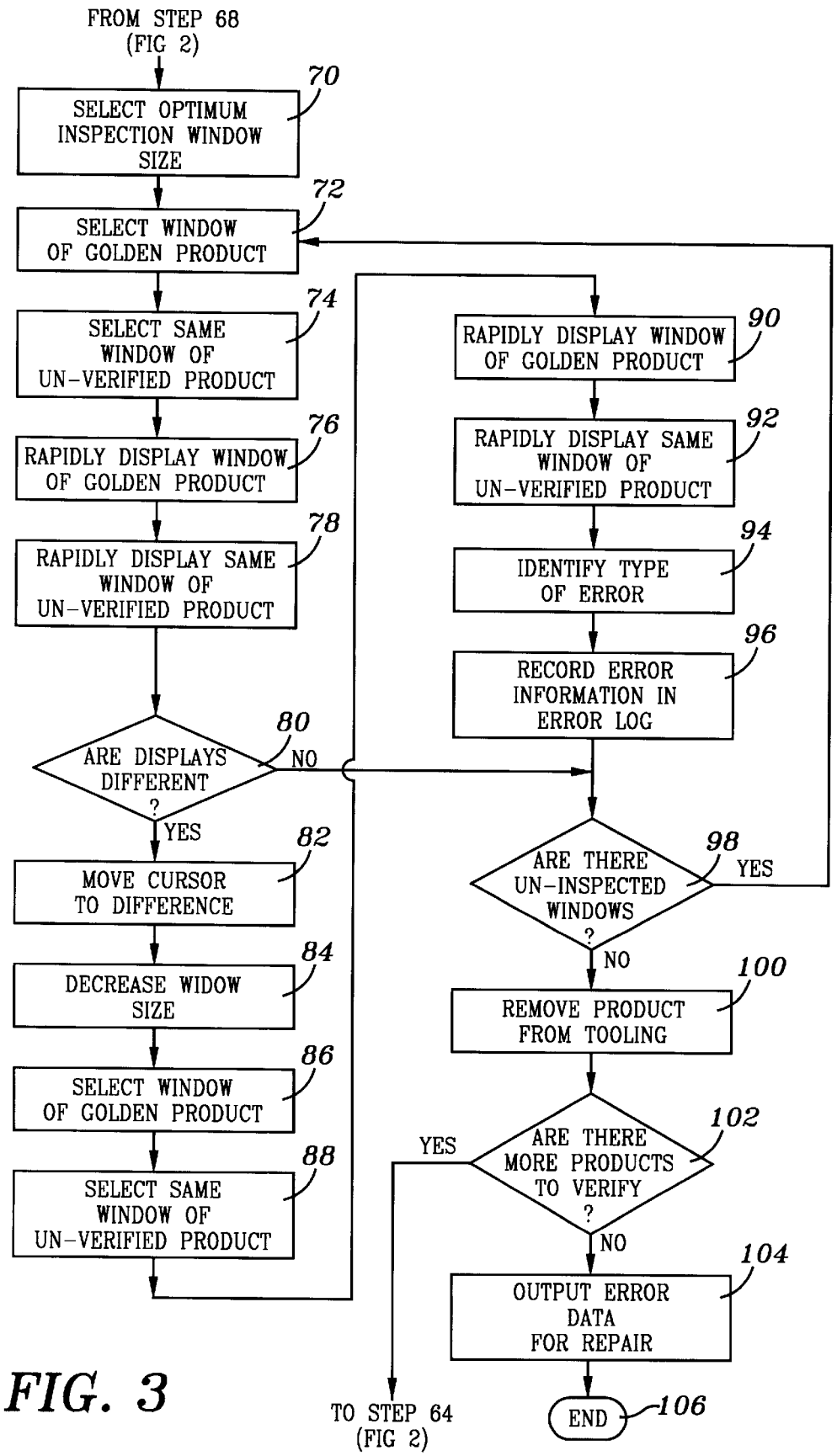

Referring now to FIGS. 2 and 3, the present method steps of the present invention are illustrated in block diagram format. Testing begins at step 30. The potential "Golden" board is positioned for scanning within scanner 12 at step 32. Computer aided design (CAD) data is obtained from processor 22 at step 34. The CAD data is sorted by component type at step 36. Optimum scanning resolution is selected at step 38. The "Golden" board is scanned by scanner 12 at step 40. The CAD data and captured image are aligned at step 42. At step 44, the first component mounted on the Golden board 14 is selected. A display is created at step 46 of the captured graphic image of the component with CAD data for display on display 18. At step 48, the operator verifies the component type utilizing display 18. At step 50, the operator verifies the component position, and at step 52, the operator verifies the component orientation.

At step 54, a determination is made as to whether there are any other unverified components on "Golden" board 14. If the decision is yes, the next component is selected from the CAD data at step 56, and the next step performed is step 46.

If the decision at step 54 is no, a decision is then made to determine if any errors were found in the potential "Golden" board at step 58. If errors were found, these errors are corrected at step 60 and the method returns to step 32. If no errors were found at step 58, the captured image is saved in memory 22 as the "Golden" board 14 at step 62.

The unverified board 16 is then placed within scanner 12 at step 64. The image of the unverified board is then captured by scanner 12 and stored in memory/processor 22 at step 66. At step 68, the image of the "Golden" board 14 is loaded into memory/processor 22.

At step 70, the optimum inspection window size for display on display 18 is selected. At step 72, the inspection window size of the "Golden" board 14 is selected, and at step 74, the same window size is selected for the unverified board 16.

Referring now to FIG. 3, the captured image of the Golden board 14 is rapidly displayed for the inspection window size on display 18 at step 76. At step 78, the captured image of the unverified board 16 is rapidly displayed for the same window size on display 18. At step 80, a decision is made as to whether the two displays (from steps 76 and 78) are different. If the decision is yes, a cursor, under control of keyboard 20 is moved to locate the difference in the displayed images at step 82. The size of the inspection window is decreased at step 84. The window of the Golden board is selected at step 86. The same decreased window size for the unverified board 16 is selected at step 88. The new window size for Golden board 14 is rapidly displayed on display 18 at step 90. The decreased window size of the image captured by scanner 12 of the unverified board 16 is rapidly displayed on display 18 at step 92. The operator then identifies the type of error at step 94. The error is recorded in an error log at step 96.

If there are no differences in the displays at decision step 80, a decision is made at step 98 as to whether there are any additional uninspected windows on unverified board 16. If the decision at step 98 is no, the unverified board 16 is removed from scanner 12 at step 100. A decision is then made at step 102 to determine if there are any additional boards to be verified. If the decision is no, output error data for the unverified board 16 is output for repair at step 104 and the process is completed at step 106.

If the decision is yes at step 98, the process continues back to step 72 (FIG. 2). If the decision at decision step 102 is yes, the process continues back to step 64 (FIG. 2).

It therefore can be seen that the present invention provides for a simplified process for capturing images of Golden boards and unverified boards for subsequent display to verify component identification and whether such components are properly installed on a printed circuit board.

Whereas the present invention has been described with respect to specific embodiments thereof, it will be understood that various changes and modifications will be suggested to one skilled in the art and it is intended to encompass such changes and modifications as fall within the scope of the appended claims.

What is claimed is:

1. A method for verification of components installed on a printed circuit board comprising the steps of:

capturing an image of an entire printed circuit board and components mounted thereon using a scanning device where the printed circuit board has no defects;

storing the scanned image of the printed circuit board and components mounted thereon having no defects;

capturing an image of an entire printed circuit board and components mounted thereon using a scanning device where the printed circuit board contains potential defects and incorrect component insertion;

storing the scanned image of the printed circuit board having potential defects and incorrect component insertion; and displaying on a display in an alternating sequence the stored image of the printed circuit board having no defects and overlaying registration with the stored information of the printed circuit board with potential defects and incorrect component insertion.

* * * * *